(12) United States Patent
Sjöland

(10) Patent No.: US 7,596,364 B2
(45) Date of Patent: Sep. 29, 2009

(54) MERGED LOW-NOISE AMPLIFIER AND BALUN

(75) Inventor: Henrik Sjöland, Löddeköpinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 469 days.

(21) Appl. No.: 11/608,346

(22) Filed: Dec. 8, 2006

(65) Prior Publication Data
US 2008/0136528 A1    Jun. 12, 2008

(51) Int. Cl.
*H04B 1/16* (2006.01)
*H04Q 7/20* (2006.01)

(52) U.S. Cl. ........................................ 455/341; 330/301

(58) Field of Classification Search .............. 455/341; 330/252–253, 261, 276, 301
See application file for complete search history.

(56) References Cited

U.S. PATENT DOCUMENTS

| | | | |
|---|---|---|---|
| 6,366,171 B1 | 4/2002 | Litmanen et al. | |
| 6,707,367 B2 | 3/2004 | Castaneda et al. | |
| 6,801,114 B2 | 10/2004 | Yang et al. | |
| 6,978,125 B2 | 12/2005 | Lindell et al. | |
| 7,039,381 B2 | 5/2006 | Yang et al. | |
| 7,088,214 B2 | 8/2006 | Castaneda et al. | |
| 7,091,814 B2 | 8/2006 | Kyriazidou | |
| 7,193,475 B2* | 3/2007 | Su et al. ............ | 330/301 |
| 2002/0187768 A1 | 12/2002 | Lin | |
| 2003/0042983 A1 | 3/2003 | Hollenbeck et al. | |
| 2003/0197575 A1 | 10/2003 | Rofougaran et al. | |
| 2004/0253939 A1 | 12/2004 | Castaneda et al. | |
| 2005/0043006 A1 | 2/2005 | Bhatti et al. | |
| 2006/0091958 A1 | 5/2006 | Bhatti et al. | |
| 2006/0103468 A1 | 5/2006 | Su et al. | |

FOREIGN PATENT DOCUMENTS

| | | | |
|---|---|---|---|
| WO | 2006/085238 A1 | 8/2006 | |
| WO | 2006/085239 A1 | 8/2006 | |

OTHER PUBLICATIONS

Lee, C.S. et al., "A Low Noise Amplifier for a Multi-band and Multi-mode Handset", 1998 IEEE Radio Frequency Integrated Circuits (RFIC) Symposium, pp. 47-50, Baltimore, MD, USA, Jun. 7-9, 1998.
Zhou, W. et al., "Using Capacitive Cross-Coupling Technique in RF Low Noise Amplifiers and Down-Conversion Mixer Design", Proc. 26th European Solid-State Circuits Conference 2000, ESSCIRC '00, pp. 116-119, Stockholm, Sweden, Sep. 19-21, 2000.

(Continued)

*Primary Examiner*—Lee Nguyen
(74) *Attorney, Agent, or Firm*—Potomac Patent Group PLLC

(57) ABSTRACT

An RF amplifier can include a differential inductor for single-ended-to-differential signal conversion. With a center tap of the differential inductor coupled to signal ground and the RF input signal coupled to one of the end taps of the inductor, the negative of the RF input signal is obtained at the other end tap of the inductor. The differential RF signal produced can be coupled to a differential transistor amplifier that has cross-coupling capacitances, improving the signal balance of the differential output signal.

20 Claims, 3 Drawing Sheets

OTHER PUBLICATIONS

Rajashekharaiah, M. et al., "A Compact 5.6 GHz Low Noise Amplifier with New On-chip Gain Controllable Active Balun", IEEE Workshop on Microelectronics and Electron Devices, pp. 131-132, Apr. 2004.

Gunnarsson, S. et al., "Highly Integrated 60 GHz Transmitter and Receiver MMICs in a GaAs pHEMT Technology", IEEE Journal of Solid-State Circuits, vol. 40, No. 11, pp. 2174-2186, Nov. 2005.

Phansathitwong, K. et al., "Low Power 0.18µm CMOS Dual-Band Front-End", Proc. A-SSCC 2005, pp. 81-84, Hsinchu, Taiwan, Nov. 2005.

Gordon, M. et al., "65-GHz Receiver in SiGe BiCMOS Using Monolithic Inductors and Transformers", 6th Topical Meeting on Silicon Monolithic Integrated Circuits in RF Systems, Technical Digest pp. 265-268, San Diego, CA, USA, Jan. 18-20, 2006.

\* cited by examiner

MERGED LOW-NOISE AMPLIFIER AND BALUN

This invention relates to electronic circuits and more particularly to electronic signal amplifiers and even more particularly to electronic signal amplifiers in communication systems.

BACKGROUND

The front end of a typical radio receiver, such as a mobile telephone for just one of many examples, typically includes one or more electronic integrated circuits, or chips, that include suitable amplifiers, filters, mixers, and other components needed to convert radio-frequency (RF) signals provided to the front end by an appropriate antenna into signals that are used by the receiver's other parts, which themselves typically include one or more chips. Each chip package has a suitable number of leads for power and input and output signals, and the chip packages are commonly disposed on one or more circuit boards.

For example, U.S. Pat. No. 6,978,125 to Lindell et al. describes a dual-band direct-conversion radio receiver, and FIG. 1 is a block diagram of the front end 100 of such a receiver. A received RF signal is supplied by an antenna 101 to a band-selection filter 102, which selects frequency bands that may be, for example, between 1805 MHz and 1990 MHz. The output of the filter 102 is supplied to a low-noise amplifier (LNA) 104, and the resulting filtered, amplified RF signal is down-converted to respective analog in-phase (I) and quadrature (Q) baseband signals by respective mixers 106, 108, which combine the filtered, amplified RF signal with respective signals from a local oscillator (LO) 110 that are 90 degrees out of phase with respect to each other. The phase-shifted LO signal can be conveniently produced by a suitable phase-shifter 112. As shown in FIG. 1, the analog I and Q baseband signals are supplied to respective filters 114, 116, and respective amplifiers 118, 120, and the resultant filtered, amplified analog signals are converted into digital signals by respective analog-to-digital (A/D) converters 122, 124. The digital I, Q signals are then provided to further processing components in the receiver, such as decoders, descramblers, de-interleavers, equalizers, combiners, etc.

The RF signal from the antenna 101 is usually single-ended, or unbalanced, which is to say that the RF signal is a voltage referenced to a known potential, such as ground. The RF signal should enter the radio chip, i.e., the chip in the receiver front end that is connected to the antenna, as a single-ended signal to save costly chip area, board area, and package leads. Nevertheless, the signals on a chip are typically differential, or balanced, signals for several reasons, such as noise immunity, cancellation of even-order non-linearity, and insensitivity to ground-lead inductance. In differential signaling, one wire carries the signal, and another wire carries the inverse of the signal, with a receiving device responding to the difference between the two wires.

Thus, a single-ended-to-differential conversion is needed in the receiver front end, preferably as close to the antenna in the signal chain as possible in order to exploit the advantages of differential signals. To convert an RF signal from single-ended to differential form on the chip before an LNA requires an on-chip balun. Some receivers like those in current mobile telephones use on-board band-select filters to perform the single-ended-to-differential conversion off-chip. Other receivers use on-chip transformers or differential inductors as baluns to perform the signal conversion.

International Publication WO 2006/085238 and WO 2006/085239, both by van der Heilden et al. for "Receiver Comprising an Amplifier", describe an RF receiver having an amplifier with a first bipolar-transistor differential amplifier stage. A center-tapped differential inductor connects the bases of the two first-stage transistors, and a center-tapped differential inductor connects the emitters of the first-stage transistors. The center taps of the differential inductors are connected to bias sources. The latter document also describes a circuit for compensating the input impedance of the amplifier.

U.S. Pat. No. 7,039,381 to Yang et al. for "On-Chip Differential Inductor and Applications Thereof" describes uses of on-chip differential inductors in radio applications, such as receiver front-ends, and U.S. Pat. No. 7,091,814 to Kyriazidou for "On-Chip Differential Multi-Layer Inductor" describes details of on-chip differential inductor design and fabrication.

M. Rajashekharaiah et al., "A Compact 5.6 GHz Low Noise Amplifier with New On-chip Gain Controllable Active Balun", 2004 *IEEE Workshop on Microelectronics and Electron Devices*, pp. 131-132 (April 2004) describes a dual-gain LNA for a direct conversion receiver. The first stage transistors are connected in a common-source single-ended configuration, and the LNA has a second gain stage that is gain-controllable, on-chip, and is an active balun for single-ended-to-differential conversion.

C.-S. Lee et al., "A Low Noise Amplifier for a Multi-band and Multi-mode Handset", 1998 *IEEE Radio Frequency Integrated Circuits (RFIC) Symposium*, pp. 47-50, Baltimore, Md., USA (7-9 Jun. 1998) discusses a low noise active balun and a push-pull active matching circuit in a wideband LNA integrated circuit.

U.S. Patent Application Publication No. US 2002/0187768 by Lin for "Active Balun Circuit for Single-Ended to Differential RF Signal Conversion with Enhanced Common-Mode Rejection" describes an active balun for single-ended-to-differential RF signal conversion. The circuit includes a differential amplifier.

U.S. Pat. No. 6,366,171 to Litmanen et al. describes a single-ended-to-differential signal transformation circuit that includes a phase analysis circuit and a compensation circuit to improve the phase balance of generated differential signals.

U.S. Patent Application Publication No. US 2004/0253939 by Castenada et al. for "Integrated Circuit Radio Front-End Architecture and Applications Thereof" describes a radio receiver front-end circuit that includes a multi-tap balun and an LNA, which can be on-chip components. The balun includes a single-ended primary winding and a symmetrical multi-tap secondary winding.

U.S. Patent Application Publication No. US 2006/0103468 by Su et al. for "Single-Ended Input to Differential Output Low Noise Amplifier with a Cascode Topology" describes an LNA using a cascode topology with an objective of reduced current and area compared with prior LNAs.

M. Gordon et al., "65-GHz Receiver in SiGe BiCMOS Using Monolithic Inductors and Transformers", 6th *Topical Meeting on Silicon Monolithic Integrated Circuits in RF Systems*, Technical Digest pp. 265-268, San Diego, Calif., USA (18-20 Jan. 2006) discusses an integrated radio receiver including among other things an LNA and a transformer balun.

The use of transformers and differential inductors as baluns is not without problems. It is difficult to make such transformers having low signal loss, well balanced output signals, and low chip area. Any signal loss directly impairs the noise figure of the receiver, and if the output signals are not well balanced, the cancellation of even-order nonlinearity suffers. Chip area must be minimized to minimize the front end's size and cost. The use of several frequency bands in a modern mobile telephone further complicates the problem because it is desirable to use a single circuit for the several bands, and thus low loss and well balanced signals are needed over a wide frequency range.

A capacitive cross-coupling (CCC) technique can be used in RF amplifiers to improve amplifier performance, especially in common-gate and common-source transistor input stages. The CCC technique is described in, for example, W. Zhuo et al., "Using Capacitive Cross-Coupling Technique in RF Low Noise Amplifiers and Down-Conversion Mixer Design", *Proc. 26th European Solid-State Circuits Conference* 2000, *ESSCIRC '00*, pp. 116-119, Stockholm, Sweden (19-21 Sep. 2000). Briefly stated, two cross-coupling capacitors connect the gates and sources of the two input-stage transistors. The Zhuo et al. paper shows a schematic diagram of an LNA with CCC, in which the cross-coupling capacitors are 10 picofarad (pF) poly-to-poly devices and the sources of the input-stage transistors are connected to ground by respective off-chip inductors that resonate with the gate-source capacitances and input parasitic capacitance at the frequency of interest.

U.S. Patent Application Publication No. US 2003/0042983 by Hollenbeck et al. for "Single Ended Input, Differential Output Amplifier" describes an amplifier having two CCC field-effect transistors (FETs) in a common-gate configuration that have their sources coupled through respective inductors to a source bias voltage. The inductors are not integrated on the same chip as the FETs, and the inductors are not coupled. A single-ended input RF signal is presented to the source of one of the FETs, but a resistor matching the input signal source is needed to obtain a well-balanced output signal. That necessary resistor adds noise, which renders the noise performance of the amplifier unsuitable for many applications.

These and other prior approaches to low-noise amplification and single-ended-to-differential signal conversion still suffer from drawbacks in various applications, such as receiver front ends in mobile telephones and other devices. Since the first on-chip block in the signal chain of a receiver is often the LNA, it would be beneficial to have an LNA that not only amplifies the signal but also converts it from single-ended to differential form.

SUMMARY

In accordance with aspects of this invention, there is provided an electronic amplifier for receiving a single-ended input signal and generating a differential output signal. The amplifier includes at least two transistors arranged in a differential configuration and a center-tapped differential inductor for converting the single-ended input signal into a differential signal to be amplified. The at least two transistors have respective first terminals for receiving signals to be amplified, and a control terminal of a first one of the at least two transistors is coupled through a first capacitance to the first terminal of a second one of the at least two transistors, and a control terminal of the second one of the at least two transistors is coupled through a second capacitance to the first terminal of the first one of the at least two transistors. A center tap of the differential inductor is coupled to signal ground, the single-ended input signal is provided to an end tap of the differential inductor, and the differential signal to be amplified is provided at end taps of the differential inductor.

In accordance with other aspects of this invention, there is provided a method, in an electronic circuit, of generating a differential electronic signal from a single-ended electronic signal. The method includes the steps of arranging at least two transistors in a differential configuration, in which the at least two transistors have respective first terminals for receiving signals to be amplified; capacitively coupling a control terminal of a first one of the at least two transistors to the first terminal of a second one of the at least two transistors; capacitively coupling a control terminal of a second one of the at least two transistors to the first terminal of the first one of the at least two transistors; and converting the single-ended input signal into a differential signal to be amplified. The converting step includes coupling a center tap of a differential inductor to signal ground, providing the single-ended input signal to an end tap of the differential inductor, and providing the differential signal to be amplified at end taps of the differential inductor.

BRIEF DESCRIPTION OF THE DRAWINGS

The objects, features, and advantages of this invention will be understood by reading this description in conjunction with the drawings, in which.

DETAILED DESCRIPTION

The inventor has recognized that single-ended-to-differential RF signal conversion can be performed on-chip by a differential inductor instead of a high-performance transformer. By connecting a center tap of the differential inductor to ground and the RF input signal to one of the end taps of the inductor, the negative of the RF input signal is obtained at the other end tap of the inductor. In this way, a differential RF input signal is produced, and such a differential signal can be connected to a device, such as a differential-transistor LNA.

The inventor has further recognized that the differential signal produced by a differential inductor as a balun is not well balanced, having a high common-mode content. The poor signal balance can be improved, that is to say, the common-mode content of the differential signal can be reduced, by providing the RF signal to the input of a CCC common-gate LNA. It will be appreciated that common-source or other differential-amplifier configurations can be used, but a common-gate configuration is currently believed to be preferable. The CCC common-gate LNA not only reduces the common-mode content, it also can provide an input impedance match across a wide frequency band and can amplify the RF signal with a low noise figure. Aspects of CCC common-gate LNA design are described in K. Phansathitwong and H. Sjöland, "Low Power 0.18 μm CMOS Dual-Band Front-End," *Proc. A-SSCC* 2005, pp. 81-84, Hsinchu, Taiwan (November 2005).

Figure 2:
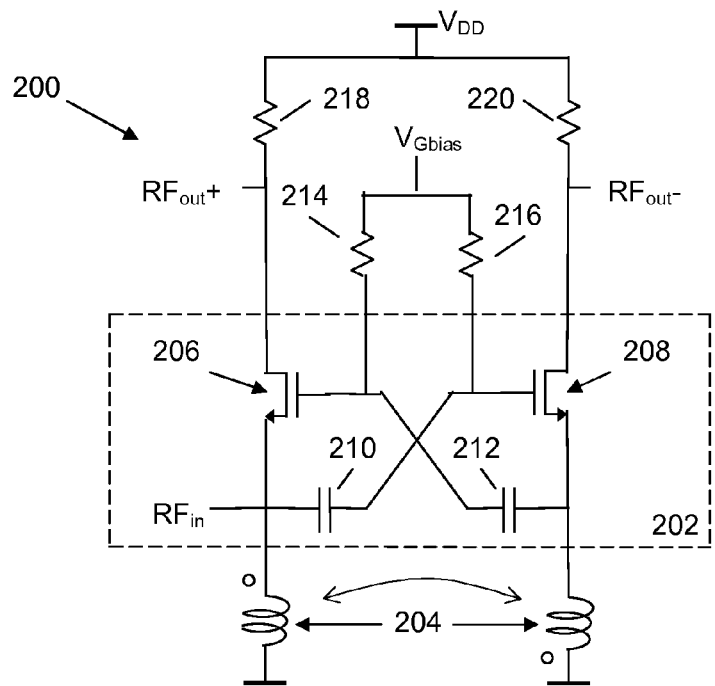
FIG. 2 is a schematic diagram of a combined low-noise amplifier and balun.

FIG. 2 is a schematic diagram of an exemplary LNA 200, which includes a differential transistor amplifier 202 and a differential inductor 204. As shown in FIG. 2, the differential amplifier 202 includes two FETs 206, 208 in a common-gate configuration, and the control terminals of the transistors, i.e., the gates of the FETs 206, 208, are cross-coupled by capacitances 210, 212. The capacitances 210, 212 can be realized by capacitors that can be quite small and should be put on-chip.

The capacitances must be substantially larger than the gate-source capacitances of the transistors, which depend on the transistor technology (e.g., CMOS, bi-polar, etc.). A typical cross-coupling capacitance is about 1 pF or 2 pF, and more information about suitable capacitances can be found in the Phansathitwong et al. paper cited above. The gates are also biassed through a suitable network, e.g., by a voltage source $V_{Gbias}$, which may be adjustable, that is coupled through respective resistances 214, 216. The drains of the FETs 206, 208 are coupled through respective suitable drain resistances 218, 220 to a power supply $V_{DD}$. Instead of resistances 218, 220, the drains of the FETs can be coupled to $V_{DD}$ by other networks, e.g., parallel inductor-capacitor (LC) resonant circuits.

The sources of the FETs 206, 208 are coupled to the differential inductor 204 such that the signals to be amplified, which are presented to the amplifier 202 at the FET sources, are 180 degrees out of phase with each other. One way to implement such an arrangement is to couple a center tap of the inductor 204 to signal ground and to couple the end taps, or terminals, of the inductor 204 to respective junctions of the FET sources and capacitances 210, 212. It will be understood that the inductor 204 can be realized in many ways, and that the resistances 214, 216, 218, 220 can be realized in many ways with active and/or passive devices and/or networks of such devices. An inductor with a strong magnetic coupling is beneficial, but conventional designs can also be used, and a standard multi-turn differential inductor is currently believed to be adequate.

It will be appreciated that a center-tapped transformer and a differential Inductor can be considered electrical equivalents for purposes of this description. Moreover, it is currently believed that there may be advantages to tapping the inductor/transformer at a place other than the center (thereby partially unbalancing the input signal). Tapping off-center could be beneficial in fine-tuning a design to minimize the common-mode signal level.

Figure 1:
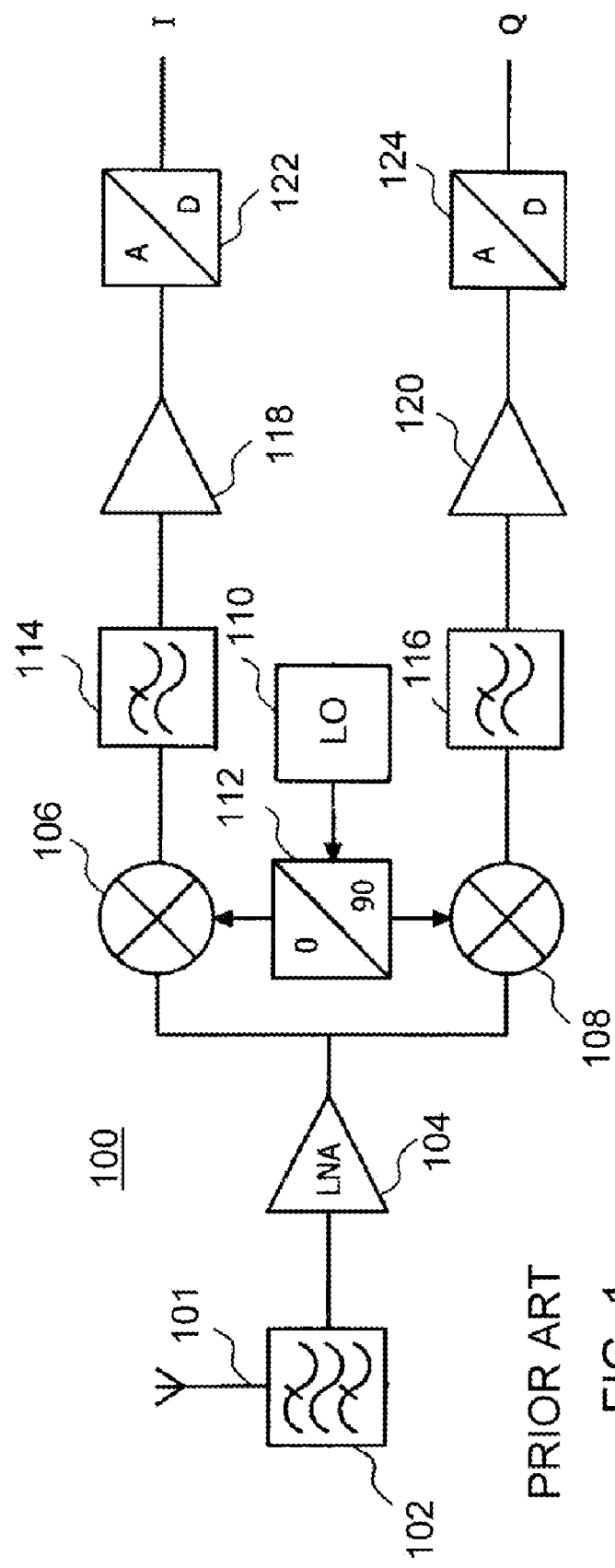
FIG. 1 is a block diagram of a prior art front end of a radio receiver.

A single-ended RF signal from a suitable antenna, such as the antenna 101 depicted in FIG. 1, is provided to the junction of the differential inductor 204, the source of one of the transistors 206, 208, and one of the coupling capacitances 210, 212. In FIG. 2, an input signal $RF_{in}$ is shown as provided to an end tap of the differential inductor 204, which in the arrangement depicted in FIG. 2 is also a junction of the end tap and the source of FET 206. As an alternative in the arrangement of FIG. 2, the input signal can be provided to the junction of an end-tap of the differential inductor 204 and the source of FET 208. The amplified differential output signal of the LNA 200 is taken between the outputs $RF_{out}+$ and $RF_{out}-$, which are the drains of the FETs 206, 208, and that output signal is provided to later devices in the signal chain of the receiver. For example in the front end 100, the LNA's output signal can be provided to one or more mixers for frequency translation, e.g., down-conversion to baseband.

It will be understood that other differential-amplifier configurations can be used. For example, bipolar transistors can be used instead of FETs, with the collector, base, and emitter of a bipolar device corresponding to the drain, gate, and source of a FET. In addition, a common-source configuration instead of the common-gate configuration shown in FIG. 2 can be used.

The LNA 200 can be used in a wide variety of receivers, such as the receiver front end 100 depicted by FIG. 1, for a wide variety of communication systems, such as cellular telephone systems, BLUETOOTH systems, wireless local area network (WLAN) systems like those in accordance with IEEE 802.11, etc. Cellular telephone systems include time-division multiple access (TDMA) systems, such as cellular radio telephone systems that comply with the GSM telecommunication standard and its enhancements like GSM/EDGE, and code-division multiple access (CDMA) systems, such as cellular radio telephone systems that comply with the IS-95, cdma2000, and wideband CDMA (WCDMA) telecommunication standards. Cellular telephone systems also include "blended" TDMA and CDMA systems, such as systems that comply with the universal mobile telecommunications system (UMTS) standard, which specifies a third generation (3G) mobile system being developed by the European Telecommunications Standards Institute (ETSI) within the International Telecommunication Union's (ITU's) IMT-2000 framework. The Third Generation Partnership Project (3GPP) promulgates the UMTS and WCDMA standards, and evolved 3G and fourth generation (4G) communication systems are now being planned. It will be understood that the devices and techniques described in this application can be implemented in those and many other communication systems.

Figure 3:
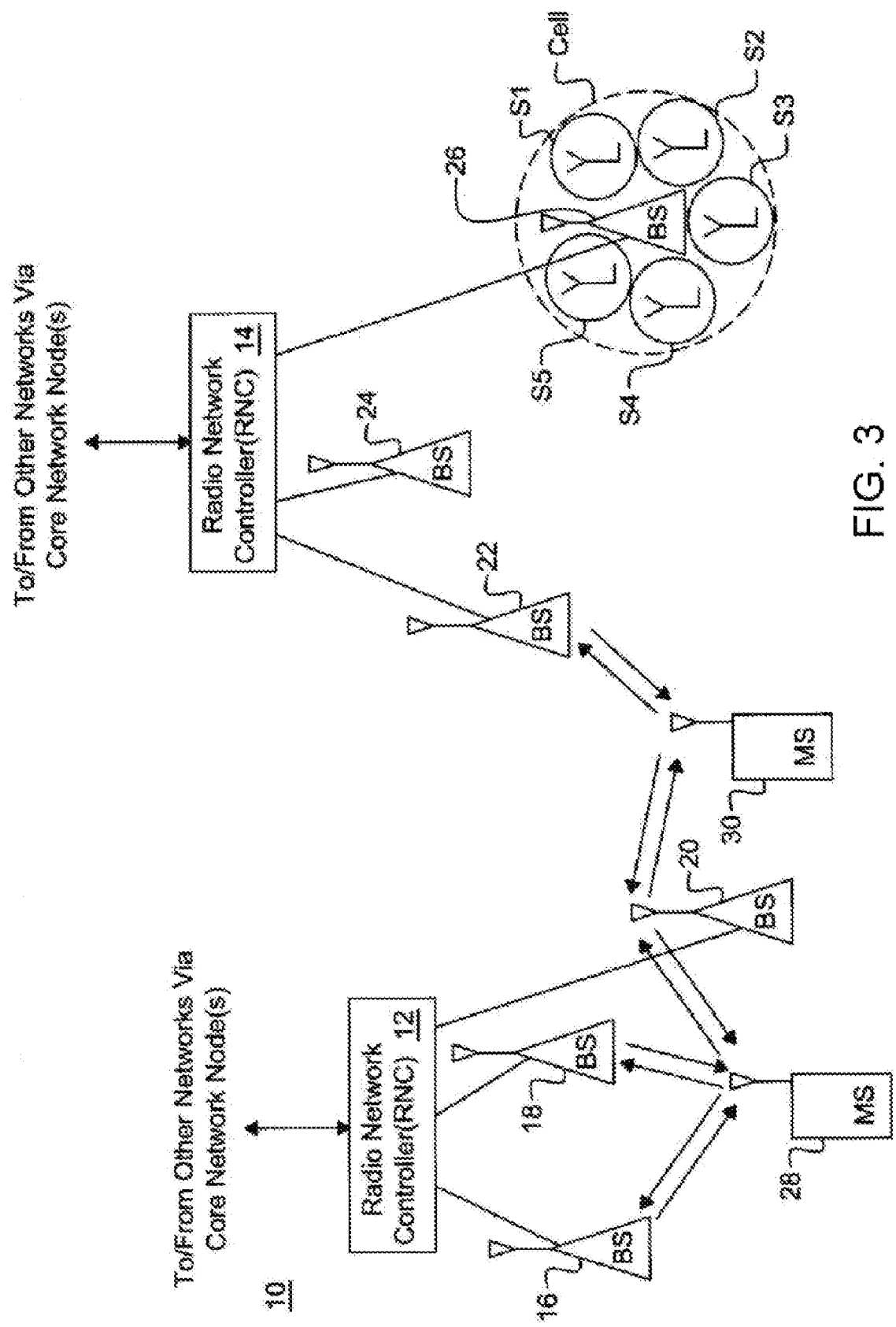
FIG. 3 depicts a cellular telephone system.

FIG. 3 depicts a radio communication system 10, which may be, for example, a WCDMA cellular telephone system. Radio network controllers (RNCs) 12, 14 direct calls and other information to and from user equipments (UEs), such as mobile stations (MSs), via appropriate base station(s) (BSs), which communicate with each UE through downlink (DL), or forward (i.e., base-to-mobile), and uplink (UL), or reverse (i.e., mobile-to-base), radio channels. RNC 12 is shown coupled to BSs 16, 18, 20, and RNC 14 is shown coupled to BSs 22, 24, 26. Each BS, which is called a Node B in 3GPP parlance, serves a geographical area that can be divided into one or more cell(s). BS 26 is shown as having five antenna sectors S1-S5, which can be said to make up the cell of the BS 26. The BSs are coupled to their corresponding RNCs by dedicated telephone lines, optical fiber links, microwave links, etc. Both RNCs 12, 14 are connected with external networks such as the public switched telephone network (PSTN), the Internet, etc. through one or more core network nodes, such as a mobile switching center (not shown) and/or a packet radio service node (not shown).

Figure 4:
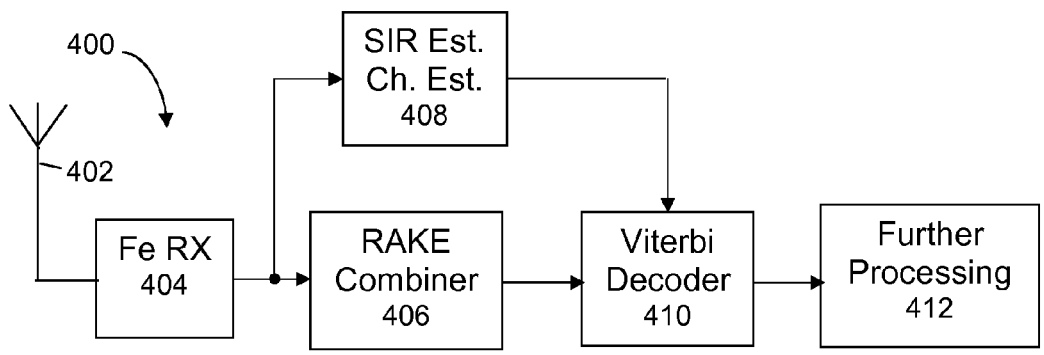
FIG. 4 is a block diagram of a portion of a user equipment in a cellular telephone system.

FIG. 4 is a block diagram of a portion of a typical UE 400, such as an MS in a WCDMA communication system. The UE 400 receives and transmits RF signals through an antenna 402 and for example down-converts and samples the received signals in a front-end receiver (Fe RX) 404 that can advantageously include the LNA 200. The Fe RX 404 can advantageously include one or more of the devices of the front end 100 depicted in FIG. 1. Digital output samples of the received RF signal are fed from Fe RX 404 to a RAKE combiner 406 that de-spreads and combines received echoes of data and control symbols. Output samples from the Fe RX 404 are also typically fed to an estimator 408, which estimates the signal-to-interference ratio (SIR) and impulse response of the downlink radio channel. In the simplified diagram of FIG. 4, recovered sequences of received symbols pass from the RAKE combiner 406 to a channel decoder 410, such as a Viterbi decoder. Decoded output sequences generated by the decoder 410 pass to further processing 412 for recognition and implementation of commands and other information.

A radio receiver having an input amplifier that includes a combination of a low-noise CCC differential transistor amplifier and a differential inductor or equivalent device as balun has many operational advantages over a receiver having an amplifier with either device by itself, covering multiple frequency bands at the same time as it provides a good differential output signal with low noise.

The invention described in this application may be embodied in many different forms, not all of which are described above, and all such forms are contemplated to be within the scope of the invention.

It is emphasized that the terms "comprises" and "comprising" and "includes" and "including", when used in this application, specify the presence of stated features, steps, or components and do not preclude the presence or addition of one or more other features, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. An electronic amplifier for receiving a single-ended input signal and generating a differential output signal, comprising:
   at least two transistors arranged in a differential configuration, wherein the at least two transistors have respective first terminals for receiving signals to be amplified, and a control terminal of a first one of the at least two transistors is coupled through a first capacitance to the first terminal of a second one of the at least two transistors, and a control terminal of the second one of the at least two transistors is coupled through a second capacitance to the first terminal of the first one of the at least two transistors; and
   a center-tapped differential inductor for converting the single-ended input signal into a differential signal to be amplified, wherein a center tap of the differential inductor is coupled to signal ground, the single-ended input signal is provided to an end tap of the differential inductor, and the differential signal to be amplified is provided at end taps of the differential inductor.

2. The amplifier of claim 1, wherein the at least two transistors are either field-effect devices or bipolar devices, the first terminals are respectively either sources or emitters, and the control terminals are respectively either gates or bases.

3. The amplifier of claim 2, wherein at least one load is coupled either to at least one drain of the at least two transistors or to at least one collector of the at least two transistors.

4. The amplifier of claim 3, wherein the differential output signal is a voltage difference either between the drains of the at least two transistors or between the collectors of the at least two transistors.

5. The amplifier of claim 4, wherein the differential output signal is coupled to at least one mixer.

6. The amplifier of claim 3, wherein the differential output signal is a current difference either between the drains of the at least two transistors or between the collectors of the at least two transistors.

7. The amplifier of claim 6, wherein the differential output signal is coupled to at least one mixer.

8. The amplifier of claim 1, wherein the amplifier is included in a radio receiver.

9. The amplifier of claim 8, wherein the radio receiver is included in a radio communication system.

10. The amplifier of claim 1, wherein the at least two transistors and the center-tapped differential inductor are integrated on a chip.

11. A method, in an electronic circuit, of generating a differential electronic signal from a single-ended electronic signal, comprising the steps of:
    arranging at least two transistors in a differential configuration, wherein the at least two transistors have respective first terminals for receiving signals to be amplified;
    capacitively coupling a control terminal of a first one of the at least two transistors to the first terminal of a second one of the at least two transistors;
    capacitively coupling a control terminal of a second one of the at least two transistors to the first terminal of the first one of the at least two transistors; and
    converting the single-ended input signal into a differential signal to be amplified, wherein the converting step comprises coupling a center tap of a differential inductor to signal ground, providing the single-ended input signal to an end tap of the differential inductor, and providing the differential signal to be amplified at end taps of the differential inductor.

12. The method of claim 11, wherein the arranging step comprises arranging at least two field-effect devices or at least two bipolar devices in the differential configuration, the first terminals are respectively either sources or emitters, and the control terminals are respectively either gates or bases.

13. The method of claim 12, further comprising the step of coupling at least one load either to at least one drain of the at least two transistors or to at least one collector of the at least two transistors.

14. The method of claim 13, wherein the differential output signal is a voltage difference either between the drains of the at least two transistors or between the collectors of the at least two transistors.

15. The method of claim 14, further comprising the step of coupling the differential output signal to at least one mixer.

16. The method of claim 13, wherein the differential output signal is a current difference either between the drains of the at least two transistors or between the collectors of the at least two transistors.

17. The method of claim 16, further comprising the step of coupling the differential output signal to at least one mixer.

18. The method of claim 11, further comprising the step of including the amplifier in a radio receiver.

19. The method of claim 18, wherein the radio receiver is included in a radio communication system.

20. The method of claim 11, further comprising the step of integrating the at least two transistors and the differential inductor on a chip.

* * * * *